(12) United States Patent
Shibata

(10) Patent No.: US 6,777,787 B2
(45) Date of Patent: Aug. 17, 2004

(54) SEMICONDUCTOR DEVICE WITH WARP PREVENTING BOARD JOINED THERETO

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/814,057

(22) Filed: Mar. 22, 2001

(65) Prior Publication Data

US 2002/0008318 A1 Jan. 24, 2002

(30) Foreign Application Priority Data

Mar. 28, 2000 (JP) .......................................... 2000-089164

(51) Int. Cl.⁷ .................... H01L 23/495; H01L 23/48
(52) U.S. Cl. ........................................ 257/666; 257/777
(58) Field of Search ................................ 257/666, 777, 257/778, 723, 781

(56) References Cited

U.S. PATENT DOCUMENTS

| 6,137,687 A | * | 10/2000 | Shirai et al. | 361/749 |
| 6,165,815 A | * | 12/2000 | Ball | 438/113 |
| 6,303,997 B1 | * | 10/2001 | Lee | 257/778 |
| 6,344,682 B1 | * | 2/2002 | Tomita | 257/686 |

* cited by examiner

*Primary Examiner*—Amir Zarabian
*Assistant Examiner*—Kiesha Rose
(74) *Attorney, Agent, or Firm*—Rabin & Berdo, P.C.

(57) ABSTRACT

A semiconductor device having a semiconductor chip, a wiring board joined to one surface of the semiconductor chip and electrically connected to the semiconductor chip, and a warp preventing board joined to the other surface of the semiconductor chip and composed of the same material as that of the wiring board. An external connection member for surface mounting may be arranged on a surface, facing away from the semiconductor chip, of the wiring board.

1 Claim, 1 Drawing Sheet

SEMICONDUCTOR DEVICE WITH WARP PREVENTING BOARD JOINED THERETO

BACKGROUND OF THE INVENTION

1. Field of the Invention

The present invention relates to a semiconductor device having a structure in which a semiconductor chip is joined to a wiring board in a film shape, for example.

2. Description of Related Art

In order to reduce the mounting area of a semiconductor device, a chip size package which is an IC package of approximately the same size as the size of a semiconductor chip itself has been conventionally developed. One form of a chip size package (CSP) type semiconductor device is a surface mount type package. In the surface mount type package, a thinned semiconductor chip is joined to a film-shaped wiring board, and the film-shaped wiring board is mounted on a mounting board in electronic equipment. The wiring board joined to the semiconductor chip has an internal wiring connected to solder balls arranged in a two-dimensional manner on a lower surface of the wiring board by rewiring a plurality of pads arranged at a peripheral edge of the semiconductor chip.

In the above-mentioned construction, however, the significantly thinned semiconductor chip is joined to the wiring board having a different coefficient of thermal expansion therefrom. Accordingly, the package warps as the environmental temperature changes.

SUMMARY OF THE INVENTION

An object of the present invention is to provide a semiconductor device which can be prevented from warping, although it has a structure in which a thinned semiconductor chip is joined to a wiring board.

A semiconductor device according to the present invention comprises a semiconductor chip, a wiring board jointed to one surface of the semiconductor chip and electrically connected to the semiconductor chip, and a warp preventing board jointed to the other surface of the semiconductor chip and composed of the same material as that of the wiring board.

According to the present invention, the semiconductor chip is interposed between the wiring board and the warp preventing board which are composed of the same material (an insulating material, for example). Even if the semiconductor chip is thinned one having a thickness of approximately 100 $\mu$m, therefore, a package may not warp due to the change in the environmental temperature. That is, when the environmental temperature changes, thermal expansion or thermal contraction equally occur on both surfaces of the semiconductor chip, thereby making it possible to prevent the package from warping.

It is preferable that an external connection member for surface mounting is arranged on a surface, facing away from the semiconductor chip, of the wiring board.

By this construction, the external connection member (a solder ball, a land, etc.) is provided on the surface, facing away from the semiconductor chip, of the wiring board. Accordingly, the semiconductor device can be surface-mounted on a mounting board in electronic equipment.

It is preferable that the warp preventing board is another wiring board, another semiconductor chip electrically connected to the warp preventing board being joined to a surface, facing away from the semiconductor chip, of the warp preventing board.

By this construction, the other semiconductor chip can be further stacked on the semiconductor chip with the warp preventing board interposed therebetween. Therefore, so-called three-dimensional mounting of the semiconductor chips is possible. Consequently, high-density mounting of the semiconductor chips is possible. As a result, it is possible to improve the substantial integration degree of the semiconductor device.

It is preferable that a wiring material for electrically connecting the wiring board and the warp preventing board is interposed therebetween.

By this construction, the connecting member for electrical connection is arranged between the wiring board and the warp preventing board. Accordingly, the other semiconductor chip joined to the warp preventing board (having the function of a wiring board) can be electrically connected to the wiring board.

Similarly, a warp preventing board composed of the same material as that of the wiring board is arranged on an upper surface of the other semiconductor chip, thereby making it possible to also construct a three-dimensional stacked structure comprising three or more layers. In this case, it is preferable that a wiring material is arranged between the wiring board and the warp preventing board and among the warp preventing boards in the respective layers. Consequently, it is possible to achieve an electrical connection among the semiconductor chips in the respective layers and/or between the semiconductor chip in each of the layers and the wiring board.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
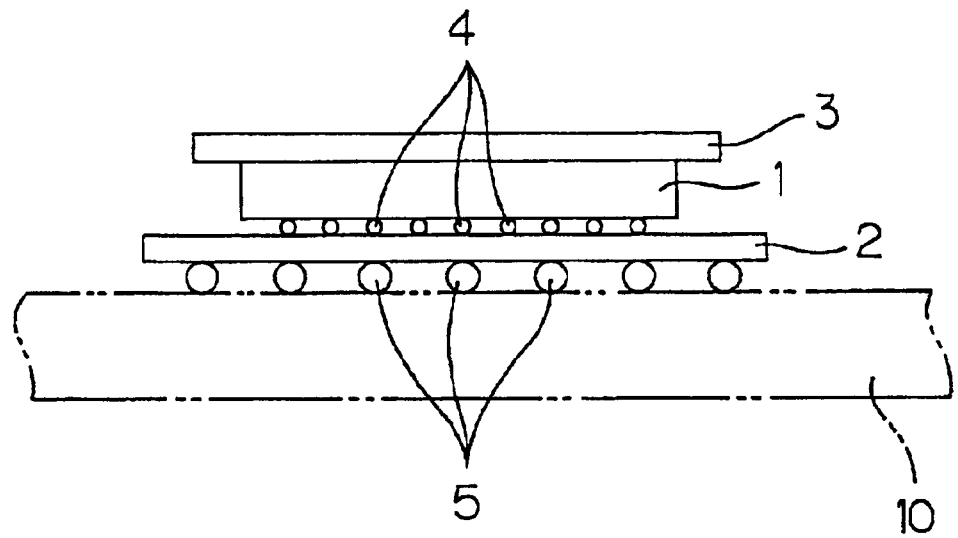
FIG. 1 is a illustrative sectional view for explaining the construction of a semiconductor device according to a first embodiment of the present invention.

FIG. 1 is an illustrative sectional view for explaining the construction of a semiconductor device according to a first embodiment of the present invention. The semiconductor device is a chip size package (CSP) type device comprising a thinned semiconductor chip 1, and a wiring board 2 and an insulating board 3 serving as a warp preventing board which are provided with the semiconductor chip 1 interposed therebetween and formed in approximately the same size as the size of the semiconductor chip 1 itself as viewed from the top.

The semiconductor chip 1 is arranged with its active surface opposed to the wiring board 2. The active surface of the semiconductor chip 1 has a plurality of solder balls 4 arranged along its peripheral edge. The semiconductor chip 1 is joined to the wiring board 2 through the solder balls 4. Consequently, an internal circuit of the semiconductor chip 1 is electrically connected to the wiring board 2.

The wiring board 2 is a film-shaped board, for example, and has an internal wiring (not shown) connected to the solder balls 4 on the semiconductor chip 1. The internal wiring is connected to a plurality of solder balls 5 (external connection members for surface mounting) arranged in a two-dimensional manner on a surface, on the opposite side of the semiconductor chip 1, of the wiring board 2. The internal wiring of the wiring board 2 is formed so as to respectively connect the solder balls 4 arranged along the peripheral edge of the semiconductor chip 1 to the solder balls 5 arranged in a two-dimensional manner on the lower surface of the wiring board 2.

On the other hand, the insulating board 3 is affixed and joined to a surface, on the opposite side of the wiring board 2, of the semiconductor chip 1 with adhesives, for example. The insulating board 3 is produced using the same insulating material as an insulating material composing the wiring board 2. The thickness of the insulating board 3 is made approximately equal to the thickness of the wiring board 2.

Consequently, the wiring board 2 and the insulating board 3 which are plate-shaped members having an equal coefficient of thermal expansion are respectively joined to the active surface and an inactive surface of the semiconductor chip 1. When the environmental temperature changes, therefore, thermal expansion and thermal contraction equally occur on the active surface and the inactive surface of the semiconductor chip 1. Accordingly, a package may not warp when the semiconductor device is used or stored, for example.

The chip size package type semiconductor device is mounted on electronic equipment by electrically connecting the plurality of solder balls 5 provided on the lower surface of the wiring board 2 to a larger mounting board 10 provided in the electronic equipment.

Figure 2:
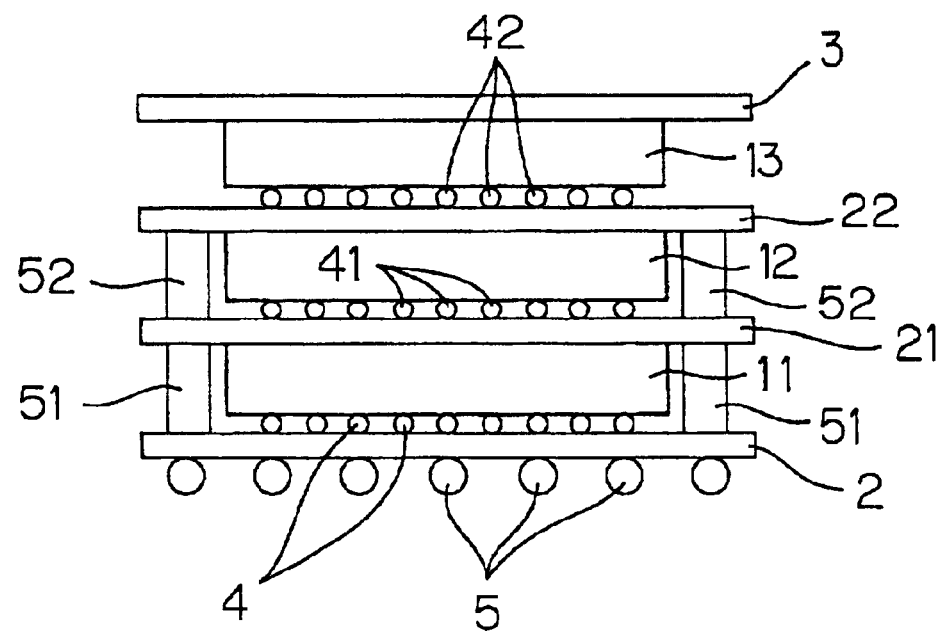
FIG. 2 is an illustrative sectional view for explaining the construction of a semiconductor device according to a second embodiment of the present invention.

FIG. 2 is an illustrative sectional view for explaining the construction of a semiconductor device according to a second embodiment of the present invention. In FIG. 2, portions corresponding to the portions shown in FIG. 1, described above, are assigned the same reference numerals as those shown in FIG. 1.

The semiconductor device is also a so-called chip size package (CSP) type device whose overall size as viewed from the top is approximately equal to the size of a semiconductor chip itself, as in the first embodiment shown in FIG. 1.

The semiconductor device according to the present embodiment is constructed by stacking a plurality of thinned semiconductor chips 11, 12, and 13. That is, the first semiconductor chip 11 is mounted on a wiring board 2, the second semiconductor chip 12 is stacked on the semiconductor chip 11 through a wiring board 21, and the third semiconductor chip 13 is stacked on the second semiconductor chip 12 through a wiring board 22.

The first semiconductor chip 11 can be electrically connected to a larger mounting board in electronic equipment through the wiring board 2 by joining solder balls 4 formed on its active surface to the wiring board 2, similarly to the semiconductor chip 1 in the above-mentioned first embodiment.

The wiring board 21 interposed between the first semiconductor chip 11 and the second semiconductor chip 12 functions, for the first semiconductor chip 11, as a warp preventing board for compensating for the difference in the coefficient of thermal expansion between the active surface and its inactive surface. The wiring board 21 functions, for the second semiconductor chip 12, as a wiring board for electrical connection to the exterior. That is, the wiring board 21 has a plurality of internal wirings (not shown) electrically connected to a plurality of solder balls 41 formed on an active surface of the second semiconductor chip 12. The internal wirings are connected to interlayer connecting members 51 (a wiring material) provided on a lower surface of the wiring board 21, that is, a surface, on the side of the first semiconductor chip 11, of the wiring board 21.

A plurality of interlayer connecting members 51 are arranged around the first semiconductor chip 11 so as to connect the internal wirings of the wiring board 2 to the internal wirings of the wiring board 21. Since the internal wirings of the wiring board 21 are connected to the interlayer connecting members 51, the second semiconductor chip 12 is electrically connected to the wiring board 2 through the solder balls 41, the internal wirings on the wiring board 21, and the interlayer connecting members 51. The interlayer connecting members 51 are connected to the internal wirings of the wiring board 2. Accordingly, it is possible to make an electrical connection between the second semiconductor chip 12 and the first semiconductor chip 11 as well as to make an electrical connection between the second semiconductor chip 12 and the mounting board in the electronic equipment on which the semiconductor device is mounted.

The third semiconductor chip 13 also has the same structure. That is, the wiring board 22 interposed between the second semiconductor chip 12 and the third semiconductor chip 13 functions, for the second semiconductor chip 12, as a warp preventing board for compensating for the difference in the coefficient of thermal expansion between the active surface and its inactive surface.

A plurality of solder balls 42 provided on an active surface of the third semiconductor chip 13 are connected to internal wirings (not shown) of the wiring board 22. The internal wirings of the wiring board 22 are respectively connected to interlayer connecting members 52 arranged between the wiring boards 21 and 22. A plurality of interlayer connecting members 52 are arranged around the second semiconductor chip 12. The interlayer connecting members 52 are connected to the internal wirings of the wiring board 21.

Consequently, the third semiconductor chip 13 can be electrically connected to the first or second semiconductor chip 11 or 12, and can be also electrically connected to the mounting board in the electronic equipment on which the semiconductor device is mounted.

An insulating board 3 is affixed to an upper surface, that is, an inactive surface of the third semiconductor chip 13 with adhesives, for example.

The wiring boards 2, 21, and 22 and the insulating board 3 are formed using the same insulating material, and are made approximately equal in thickness. Consequently, thermal expansion or thermal contraction equally occurs on the active surface and the inactive surface of each of the first, second, and third semiconductor chips 11, 12, and 13. Accordingly, any of the semiconductor chips may not warp by the change in the environmental temperature.

Although description has been made of the two embodiments of the present invention, the present invention can be also embodied in another mode. That is, although in the two embodiments, description has been made of the semiconductor device of a so-called ball grid array type in which the plurality of solder balls 5 are arranged on the lower surface of the wiring board 2 positioned on the lowermost layer, the semiconductor device and the mounting board inside the electronic equipment can be also connected to each other by an external terminal in another form. That is, a land grid array type in which a flat terminal portion (a land) connected to internal wirings of a wiring board 2 is exposed without providing solder balls 5 on a lower surface of the wiring board 2 may be employed.

Although in the above-mentioned embodiment, description has been made of an example in which the three semiconductor chips 11, 12, and 13 are stacked, a two-layer structure and a structure in which semiconductor chips in four or more layers are stacked can be realized in the same manner.

Furthermore, although in the above-mentioned embodiment, the semiconductor chip is joined to the wiring board by the solder balls, the semiconductor chip may be joined to the wiring board by forming a bump composed of an oxidation resistant metal such as gold on a surface of the semiconductor chip and joining the bump to a gold plating portion provided on a surface of the wiring board.

Although the present invention has been described and illustrated in detail, it is clearly understood that the same is by way of illustration and example only and is not to be taken by way of limitation, the spirit and scope of the present invention being limited only by the terms of the appended claims.

The application corresponds to Japanese Patent Application No. 2000-89164 filed with the Japanese Patent Office on Mar. 28, 2000, the disclosure of which is incorporated herein by reference.

What is claimed is:

1. A semiconductor device, comprising:

a semiconductor chip having a first semiconductor chip surface and a second semiconductor chip surface disposed opposite the first semiconductor chip surface, the second semiconductor chip surface defining a semiconductor chip surface area;

a wiring board having a wiring board thickness and being electrically connected to the semiconductor chip at the first semiconductor chip surface; and a warp preventing board having a warp preventing board thickness and a warp preventing board surface defining a warp preventing board surface area, wherein the warp preventing board surface and the second semiconductor chip surface are connected with each other in a face-to-face arrangement so that the warp preventing board surface area of the warp preventing board surface covers the semiconductor chip surface area of the semiconductor chip, wherein the warp preventing board thickness is substantially equal to the wiring board thickness, and the warp preventing board and the wiring board are fabricated from an identical material, wherein the warp preventing board has a coefficient of thermal expansion that is essentially equal to a coefficient of thermal expansion of the wiring board, wherein the semiconductor chip has a coefficient of thermal expansion that is different from the coefficient of thermal expansion of the warp preventing board and the wiring board, and wherein the warp preventing board and the wiring board collectively cause any thermal expansion and thermal contraction to occur essentially equally on both the first semiconductor chip surface and a second semiconductor chip surface, thereby preventing warpage of the semiconductor chip during a change in an environmental temperature.

* * * * *